United States Patent
Peng et al.

(10) Patent No.: US 11,943,913 B2
(45) Date of Patent: Mar. 26, 2024

(54) METHOD OF MANUFACTURING SEMICONDUCTOR STRUCTURE HAVING MULTI-WORK FUNCTION GATE ELECTRODE

(71) Applicant: Winbond Electronics Corp., Taichung (TW)

(72) Inventors: Te-Hsuan Peng, Taichung (TW); Kai Jen, Taichung (TW); Mei-Yuan Chou, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 18/301,572

(22) Filed: Apr. 17, 2023

(65) Prior Publication Data
US 2023/0255020 A1    Aug. 10, 2023

Related U.S. Application Data

(62) Division of application No. 17/476,006, filed on Sep. 15, 2021, now abandoned.

(51) Int. Cl.
*H10B 12/00* (2023.01)
(52) U.S. Cl.
CPC .......... *H10B 12/34* (2023.02); *H10B 12/053* (2023.02)
(58) Field of Classification Search
CPC ............................ H10B 12/053; H10B 12/34
USPC ................................................. 438/259, 270
See application file for complete search history.

(56) References Cited

U.S. PATENT DOCUMENTS

| 8,008,144 B2 | 8/2011 | Ananthan |
| 9,064,956 B2 | 6/2015 | Oh et al. |
| 2003/0022457 A1* | 1/2003 | Gutsche ............ C23C 16/45525 257/E21.651 |
| 2016/0172488 A1 | 6/2016 | Oh et al. |
| 2018/0174845 A1 | 6/2018 | Jang et al. |

FOREIGN PATENT DOCUMENTS

CN    111 668298 A    9/2020

* cited by examiner

*Primary Examiner* — Hoai V Pham
(74) *Attorney, Agent, or Firm* — Muncy, Geissler, Olds & Lowe, P.C.

(57) ABSTRACT

A semiconductor structure includes a substrate and a buried gate structure in the substrate. The buried gate structure includes a gate dielectric layer formed on the sidewall and the bottom surface of a trench in the substrate, a barrier layer formed in the trench and on the sidewall and the bottom surface of the gate dielectric layer, a first work function layer formed in the trench and including a main portion and a protruding portion, a second work function layer formed at opposite sides of the protruding portion, and an insulating layer formed in the trench and on the protruding portion of the first work function layer and the second work function layer. The barrier layer surrounds the main portion of the first work function layer. The area of the top surface of the protruding portion is less than the area of the bottom surface of the protruding portion.

15 Claims, 7 Drawing Sheets

METHOD OF MANUFACTURING SEMICONDUCTOR STRUCTURE HAVING MULTI-WORK FUNCTION GATE ELECTRODE

This application is a Divisional application of U.S. patent application Ser. No. 17/476,006, filed on Sep. 15, 2021, the entire of which is incorporated by reference herein.

BACKGROUND

Field of the Disclosure

The present disclosure is related to a semiconductor structure and a method of manufacturing the same, and in particular, it is related to the semiconductor structure of a dynamic random access memory (DRAM) and a method of manufacturing the same.

Description of the Related Art

Dynamic Random Access Memory (DRAM) devices are widely used in consumer electronic products. In order to increase the integration of components in a DRAM device and improve its overall performance, the current methods of manufacturing DRAM devices continue to improve with respect to reducing the device size. However, as device sizes continue to shrink, many challenges arise. For example, how to improve gate induced drain leakage (GIDL) is one issue of concern. Although existing methods of manufacturing DRAM devices have generally been adequate for their intended purposes, however, they have not been entirely satisfactory in all respects and still have some problems to be overcome in the methods of manufacturing DRAM devices.

SUMMARY

In some embodiments of the disclosure, a semiconductor structure is provided. The semiconductor structure includes a substrate and a buried gate structure in the substrate. In some embodiments, the buried gate structure includes a gate dielectric layer, a barrier layer, a first work function layer, and a second work function layer. The gate dielectric layer is formed on sidewalls and the bottom surface of a trench in the substrate. The trench extends downward in the substrate. The barrier layer is in the trench and on sidewalls and the bottom surface of the gate dielectric layer. The first work function layer is in the trench. The first work function layer includes a main portion, and a protruding portion. The main portion is in the lower portion of the trench. The protruding portion is on the main portion. The protruding portion connects the main portion. In some embodiments, the barrier layer surrounds sidewalls and the bottom surface of the main portion. The area of the top surface of the protruding portion is less than the area of the bottom surface of the protruding portion. Also, the second work function layer is formed at opposite sides of the protruding portion of the first work function layer. In addition, the semiconductor structure also includes an insulating layer in the trench. The insulating layer is formed on the protruding portion of the first work function layer and on the second work function layer.

In some embodiments, the method of manufacturing a semiconductor structure includes providing a substrate and forming a trench extending downward in the substrate. The method also includes forming a gate dielectric layer on sidewalls and the bottom surface of the trench, and forming a barrier layer on a lower portion of sidewalls and the bottom surface of the gate dielectric layer. In some embodiments, the method also includes forming a first work function layer on the lower portion of the trench, wherein the first work function layer includes a main portion in the lower portion of the trench, and a protruding portion on the main portion and connecting the main portion. In some embodiments, the barrier layer surrounds sidewalls and the bottom surface of the main portion, and the area of the top surface of the protruding portion is less than the area of the bottom surface of the protruding portion. In some embodiments, the method also includes forming a second work function layer at opposite sides of the protruding portion of the first work function layer. In some embodiments, the method further includes forming an insulating layer on the protruding portion of the first work function layer and on the second work function layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, similar reference numbers are used to designate similar features/components.

Figure 1A:
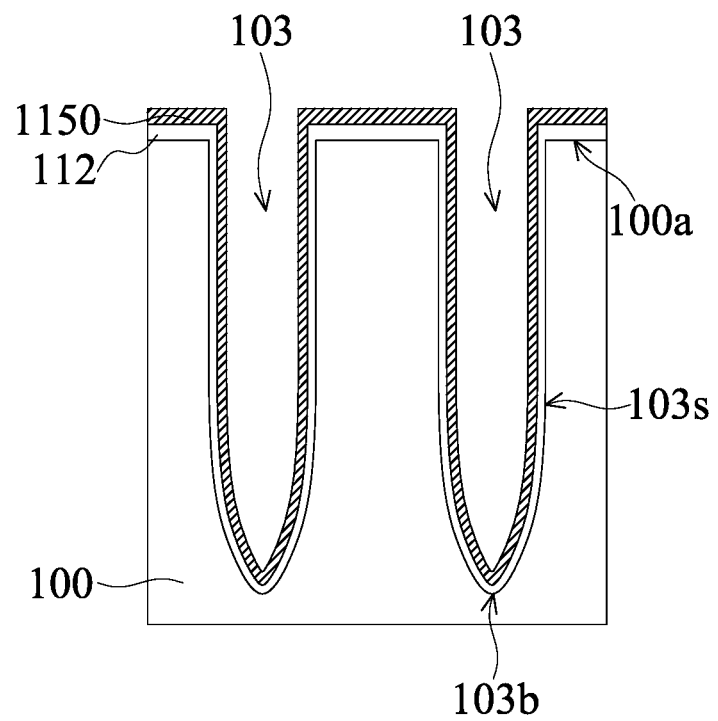
FIG. 1A-FIG. 1M are cross-sectional views of various stages of manufacturing a semiconductor structure in accordance with an embodiment of the present invention.

FIG. 1A-FIG. 1M are cross-sectional views of various stages of manufacturing a semiconductor structure in accordance with an embodiment of the present invention. Referring to FIG. 1A, a substrate 100 is provided, and the substrate 100 includes several trenches 103 extending downward from the top surface of the substrate 100. The substrate 100 may include a semiconductor material. In some embodiments, the substrate 100 includes silicon, gallium arsenide, gallium nitride, germanium silicide, another suitable substrate material, or a combination thereof. In some other embodiments, the substrate 100 is a silicon-on-insulator (SOI) substrate.

Next, a gate dielectric layer 112 is conformably formed on the surface of the substrate 100, and a barrier material layer 1150 is sequentially and conformably formed on the gate dielectric layer 112. As shown in FIG. 1A, the gate dielectric layer 112 covers the sidewalls 103s and the bottom surfaces 103b of the trenches 103 and extends to the top surface 100a of the substrate 100. The barrier material layer 1150 is formed on the gate dielectric layer 112.

In some embodiments, the gate dielectric layer 112 is a single layer structure or a multilayer structure. The gate dielectric layer 112 may include silicon oxide, silicon nitride, silicon dioxide, another suitable material, or a combination thereof. For example, the gate dielectric layer 112 may be an oxide-nitride-oxide (ONO) structure, or an oxide-nitride-oxide-nitride-oxide (ONONO) structure. To simplify the diagram, a single-layer gate dielectric layer 112 is depicted for clear illustrations. Also, the gate dielectric layer 112 can be formed by a thermal oxidation process, a deposition process, another suitable process, or a combination thereof.

In some embodiments, the barrier material layer 1150 includes one or more conductive metals. For example, the barrier material layer 1150 includes metal, metal alloy, metal nitride, or metal silicide. In some embodiments, the barrier material layer 1150 includes titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination thereof. In some embodiments, the barrier material layer 1150 is formed on the gate dielectric layer 112 by a deposition process, such as a physical vapor deposition (PVD) process, a chemical vapor deposition (CVD) process, or an atomic layer deposition (ALD) process.

Figure 1B:
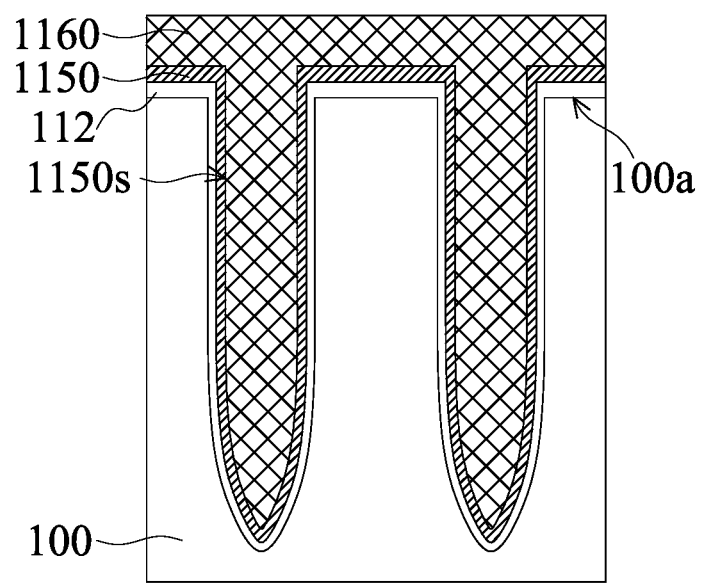

Next, referring to FIG. 1B, a first work function material layer 1160 is formed on the barrier material layer 1150, and the trenches 103 are fully filled with the first work function material layer 1160. In one embodiment, the first work function material layer 1160 may include copper (Cu), tungsten (W), or other suitable conductive materials. Furthermore, the first work function material layer 1160 may be a single-layer conductive metal structure or a multi-layer conductive metal structure. In this example, the first work function material layer 1160 includes tungsten.

Figure 1C:
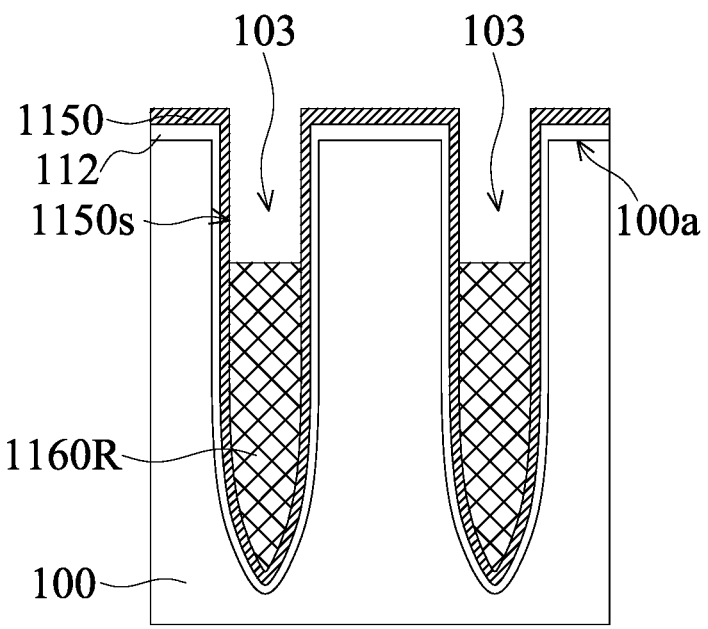

Referring to FIG. 1C, the first work function material layer 1160 is recessed subsequently. In one embodiment, the excess portions of the first work function material layer 1160 outside the trenches 103 may be removed by a chemical mechanical polishing (CMP) process, an etching back process or another suitable process. Next, the first work function material layer 1160 in the trenches 103 is recessed, such as by a selective etching process. The remaining portions 1160R of the first work function material layer 1160 are disposed in the lower portions of the corresponding trenches 103. After the first work function material layer 1160 is recessed, the upper portions of the sidewalls 1150s of the barrier material layer 1150 are exposed.

Next, according to an embodiment of the present disclosure, a mask can be formed on the remaining portions 1160R of the first work function material layer 1160 after the first work function material layer 1160 is recessed. Then, the remaining portions 1160R of the first work function material layer 1160 is etched according to the mask to remove the portion of the remaining portions 1160R of the first work function material layer 1160 that is uncovered by the mask, thereby forming the corresponding holes. Then, the aforementioned holes are filled with a second work function material. FIG. 1D to FIG. 1G illustrate one of the manufacturing methods for forming a mask on the recessed remaining portions 1160R of the first work function material layer 1160. However, it should be known in the art that the details of the steps described below are merely for illustrative purposes, and are not intended to limit the manufacturing process of the present disclosure.

Figure 1D:
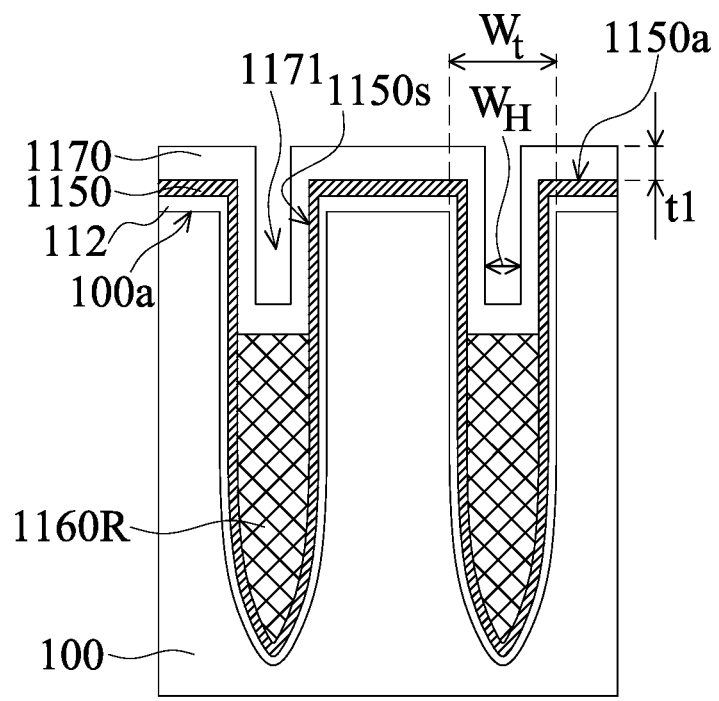

Next, referring to FIG. 1D, a first dielectric material layer 1170 is conformably deposited on the barrier material layer 1150. As shown in the FIG. 1D, the first dielectric material layer 1170 covers the top surface 1150a of the barrier material layer 1150 and the upper portions of the sidewalls 1150s of the barrier material layer 1150. Also, an opening 1171 is formed in each of the trenches 103. Furthermore, the first dielectric material layer 1170 may include silicon oxide, silicon nitride, silicon oxynitride, another suitable material, or a combination thereof. In some embodiments, the first dielectric material layer 1170 is formed by chemical vapor deposition or another suitable method.

The thickness t1 of the first dielectric material layer 1170 can be determined according to the size of a gap that is between the sidewalls of the barrier material layer 1150 in each of the trenches 103. Also, the thickness t1 of the first dielectric material layer 1170 can be used to control the width of the first portion 121 and the width of the second portion 122 of the second work function layer 120 that are formed subsequently (FIG. 1M). Specifically, the width of the opening 1171 can be controlled by adjusting the thickness t1 of the first dielectric material layer 1170, thereby controlling the width of the mask HM to be formed subsequently, in accordance with some embodiments of the present disclosure. Accordingly, the width of the first portion 121 and the width of the second portion 122 of the second work function layer 120 can be determined and controlled by controlling the width of the mask HM to meet the requirements in the applications.

As shown in FIG. 1D, in some embodiments, the width WH of the opening 1171 is in a range of about ⅙ to about ½ of the width Wt of the trench 103. For example, in one embodiment, the width WH of the opening 1171 is about ¼ of the width Wt of the trench 103. However, the present disclosure is not limited to the numerical values provided herein. The width WH of the opening 1171 can be adjusted, depending on the design requirements of the application.

Figure 1E:
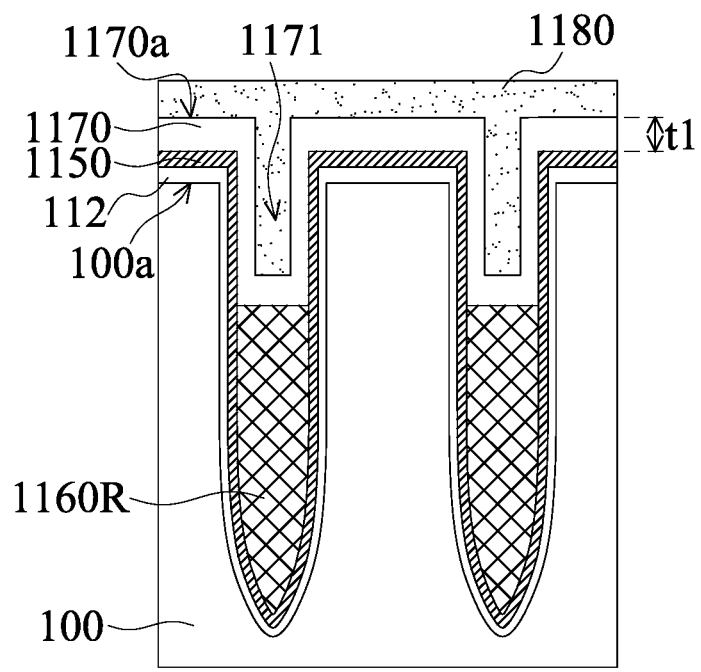

Next, referring to FIG. 1E, a second dielectric material layer 1180 is formed on the first dielectric material layer 1170, and the openings 1171 are fully filled with the second dielectric material layer 1180, in accordance with some embodiments of the present disclosure. In some embodiments, the second dielectric material layer 1180 may include silicon oxide, silicon nitride, silicon oxynitride, another suitable dielectric material, or a combination thereof. Also, the second dielectric material layer 1180 may be formed by a chemical vapor deposition (CVD) process or another suitable process.

In some embodiments, the material of the first dielectric material layer 1170 is different from the material of the second dielectric material layer 1180. For example, in one embodiment, the first dielectric material layer 1170 includes silicon oxide, and the second dielectric material layer 1180 includes silicon nitride. In another embodiment, the first dielectric material layer 1170 includes silicon nitride, and the second dielectric material layer 1180 includes silicon oxide. However, this disclosure is not limited to the aforementioned materials.

Figure 1F:
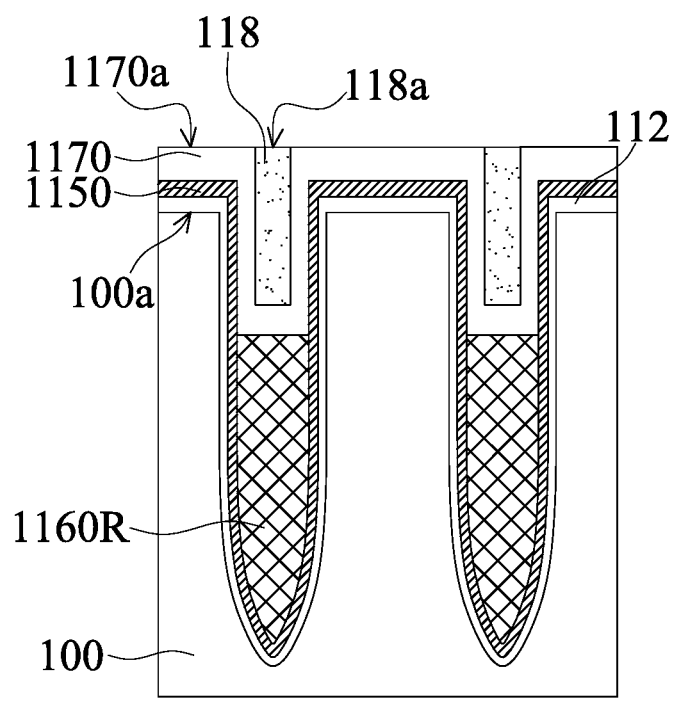

Next, referring to FIG. 1F, a portion of the second dielectric material layer 1180 is removed to expose the top surface 1170a of the first dielectric material layer 1170. In some embodiments, the second dielectric material layer 1180 outside the openings 1171 can be removed by a chemical mechanical polishing (CMP) process, an etching back process, another suitable process or a combination thereof. The remaining portions of the second dielectric material layer 1180 form the second dielectric layers 118 in the openings 1171. Accordingly, the top surface 1170a of the first dielectric material layer 1170 is level with the top surface 118a of the second dielectric layer 118 after the portion of the second dielectric material layer 1180 is removed.

Figure 1G:
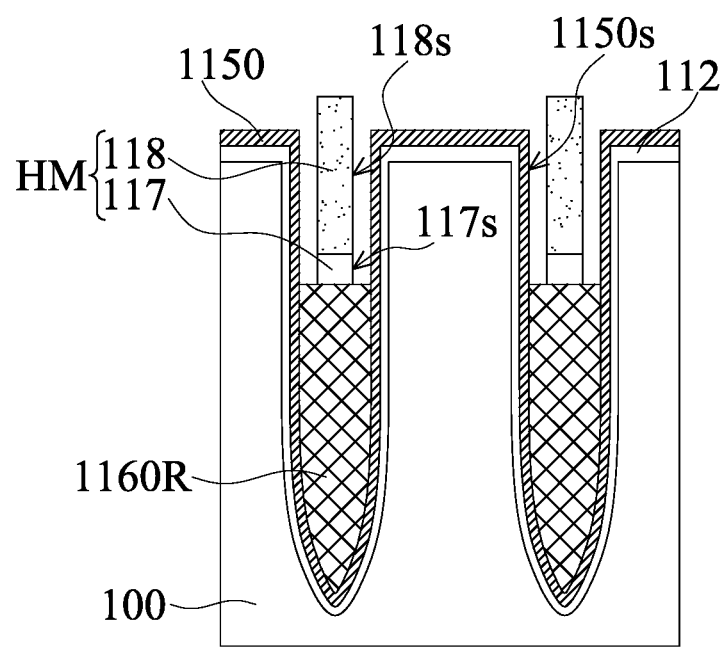

Next, referring to FIG. 1G, the portion of the first dielectric material layer 1170 that is not covered by the second dielectric layer 118 is removed. In some embodiments, the portion of the first dielectric material layer 1170 that is not covered by the second dielectric layer 118 can be removed by an etching back process. The remaining portion of the first dielectric material layer 1170 in each of the trenches 103 forms the first dielectric layer 117. As shown in FIG. 1G, the sidewalls 117s of the first dielectric layer 117 are coplanar with the sidewalls 118s of the second dielectric layer 118 in each of the trenches 103. In this embodiment, the first dielectric layer 117 and the second dielectric layer 118 collectively define a mask HM that is used in the subsequent processes.

Figure 1H:
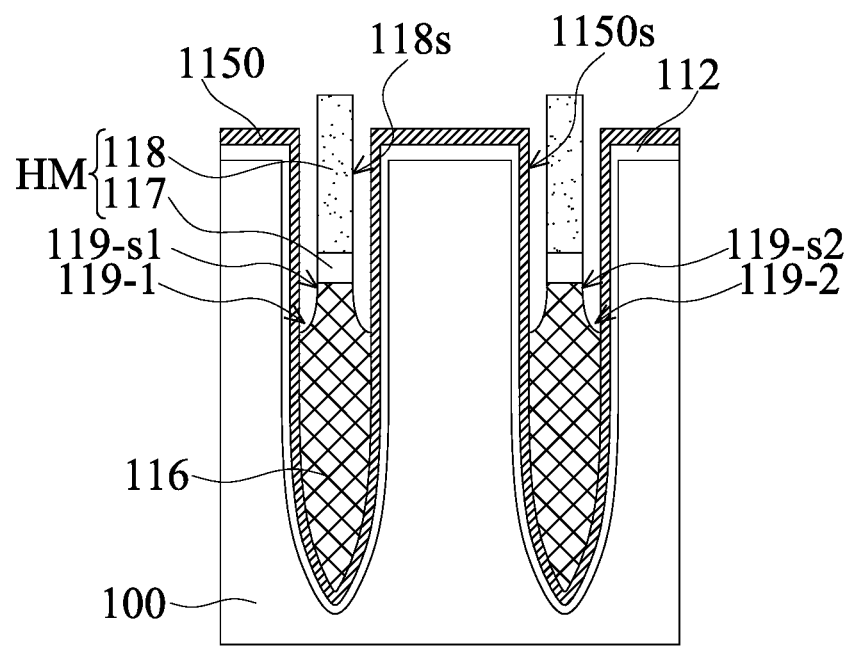

Next, referring to FIG. 1H, an etching step is performed to remove a part of the remaining portion 1160R of the first work function material layer 1160 that is not covered by the mask HM in the trench 103, thereby forming the first work function layer 116 in the trench 103. In some embodiments, the part of the remaining portion 1160R of the first work function material layer 1160 that is not covered by the mask HM in the trench 103 can be removed by, for example, reactive ion etching (RIE) or another suitable dry etching method. In this embodiment, after the etching step, the holes 119-1 and 119-2 are formed on opposite sides of the first work function layer 116 in the trench 103, respectively. It should be noted that only the mask HM is used in the etching step and no extra photomask is required for etching the remaining portion 1160R of the first work function material layer 1160. Accordingly, this etching step can be regarded as a self-aligned etching process.

Referring to FIG. 1H again, after the etching step, the size of each of the holes 119-1 and 119-2 is gradually reduced from the top surface of the remaining portion 1160R of the first work function material layer 1160 toward the direction of entering the remaining portion 1160R of the first work function material layer 1160, in accordance with some embodiments of the present disclosure. As shown in FIG. 1H, the sidewall 119-s1 of the hole 119-1 and the sidewall 119-s2 of the hole 119-2 are respectively slanted to the sidewall 1150s of the barrier material layer 1150. In one embodiment, the sidewall 119-s1 of the hole 119-1 and the sidewall 119-s2 of the hole 119-2 are arc-shaped sidewalls.

Figure 1I:
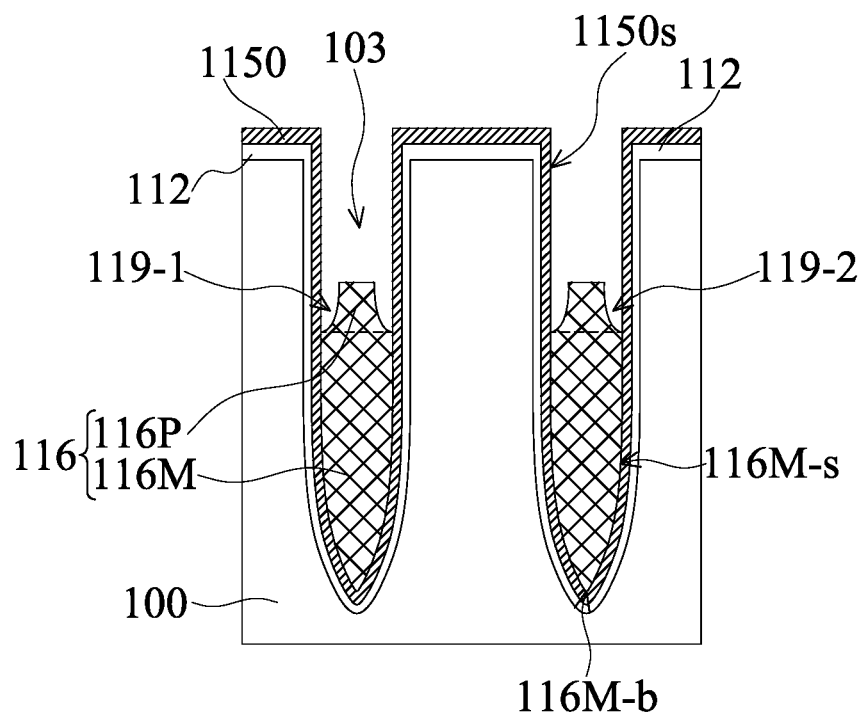

Next, referring to FIG. 1I, the mask HM is removed. In some embodiments, the first dielectric layer 117 and the second dielectric layer 118 in each of the trenches 103 are removed to expose the first work function layer 116. As shown in FIG. 1I, the first work function layer 116 includes a main portion 116M and a protruding portion 116P. In this embodiment, the main body 116M is positioned in the lower portion of the corresponding trench 103, and the protruding portion 116P is disposed on the main body 116M.

Figure 1J:
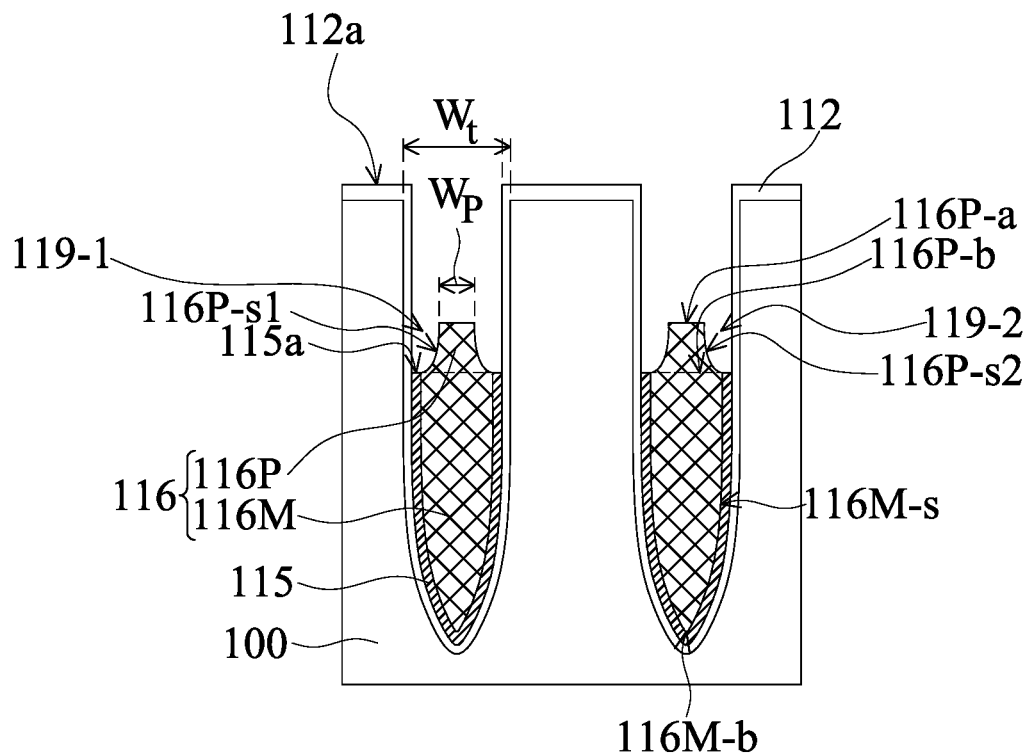

Next, referring to FIG. 1J, a portion of the barrier material layer 1150 is removed, and the remaining portion of the barrier material layer 1150 forms a barrier layer 115. In one embodiment, the upper portion of the barrier material layer 1150 can be removed. For example, as shown in FIG. 1J, in each of the trenches 103, the portions of the barrier material layer 1150 that are higher than the bottom surfaces of the hole 119-1 and the hole 119-2 are removed. The remaining barrier layer 115 surrounds the side surface 116M-s and the bottom surface 116M-b of the main portion 116M, in accordance with some embodiments of the present disclosure. In addition, the top surface 115a of the barrier layer 115 may be substantially level with the bottom surface 116P-b of the protruding portion 116P. In one embodiment, the removal of the portion of the barrier material layer 1150 can be performed by, for example, a dry etching process, a wet etching process, another suitable process, or a combination thereof.

Referring to FIG. 1J again, the width of the protruding portion 116P of the first work function layer 116 gradually increases from the top surface 116P-a of the protruding portion 116P toward the bottom surface 116P-b of the protruding portion 116P. In one embodiment, the width Wp of the top surface 116P-a of the protruding portion 116P of the first work function layer 116 is in a range of about ⅙ to about ½ of the width Wt of the trench 103, in accordance with some embodiments of the present disclosure. In some embodiments, the width Wp of the top surface 116P-a of the protruding portion 116P of the first work function layer 116 is in a range of about ⅓ to about ½ of the width Wt of the trench 103. In one example, the width Wp of the top surface 116P-a of the protruding portion 116P is about ½ of the width Wt of the trench 103.

Figure 1K:
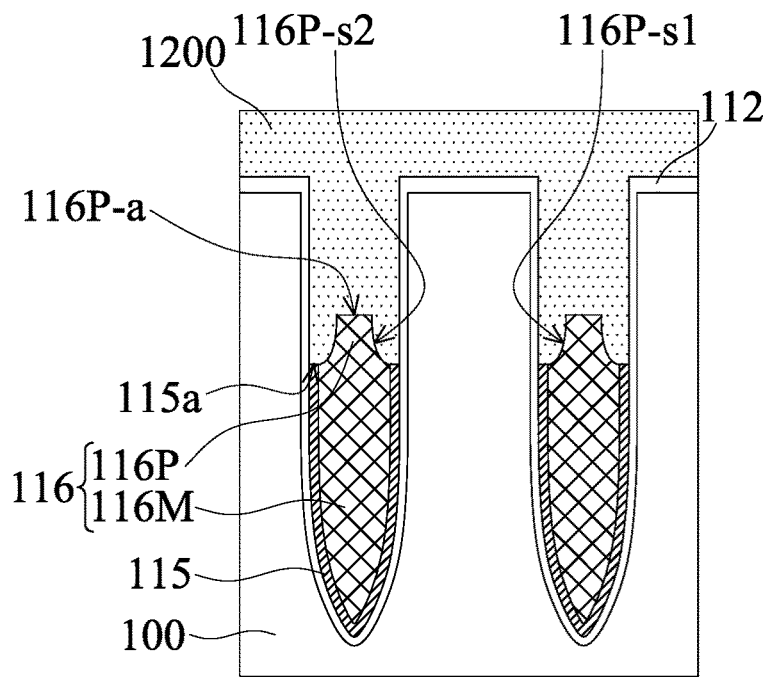

Next, referring to FIG. 1K, a second work function material layer 1200 is formed on the barrier layer 115 and the first work function layer 116, in accordance with some embodiments of the present disclosure. The second work function material layer 1200 covers the barrier layer 115 and fills the trenches 103. The second work function material layer 1200 further fills the holes 119-1 and 119-2 at opposite sides of the protruding portion 116P of the first work function layer 116. In some embodiments, the second work function material layer 1200 includes doped or undoped polysilicon, metal, metal alloy, metal nitride, or metal silicide. In some embodiments, the second work function material layer 1200 includes polysilicon, titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination thereof. In some embodiments, the second work function material layer 1200 can be formed by a deposition process, such as a physical vapor deposition (PVD) process, a chemical vapor deposition (CVD) process, an atomic layer deposition (ALD) process, another suitable process, or a combination thereof.

In some embodiments, the material of the second work function material layer 1200 is different from the material of the barrier layer 115. Also, the material of the second work function material layer 1200 is different from the material of the first work function layer 116. In addition, the work function of the second work function material layer 1200 is less than the work function of the barrier layer 115, and the work function of the barrier layer 115 is less than the work function of the first work function layer 117, in accordance with some embodiments of the present disclosure.

Figure 1L:
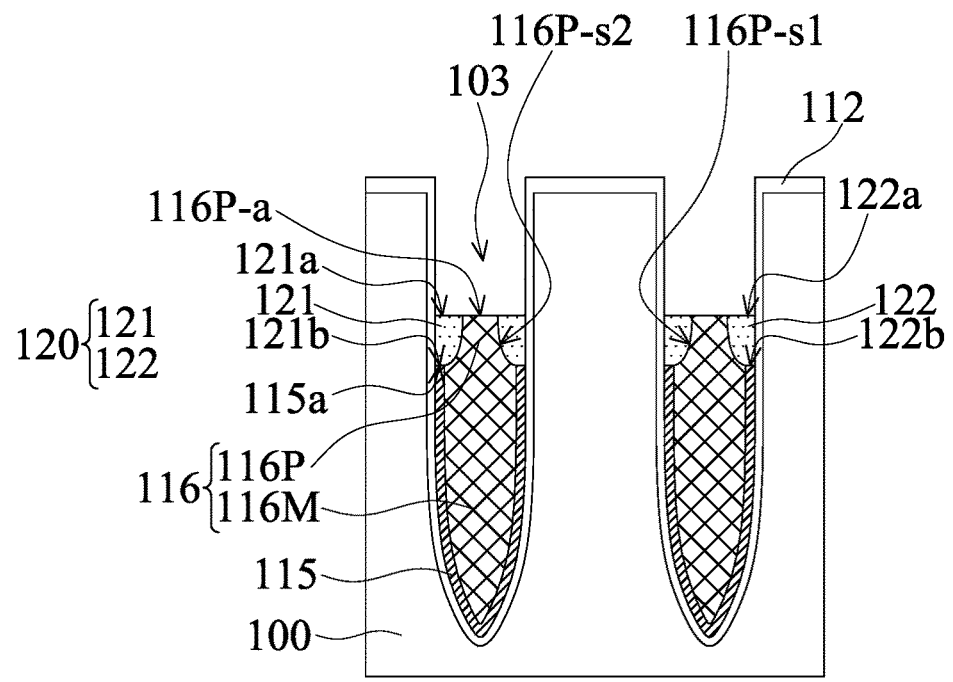
Figure 1M:
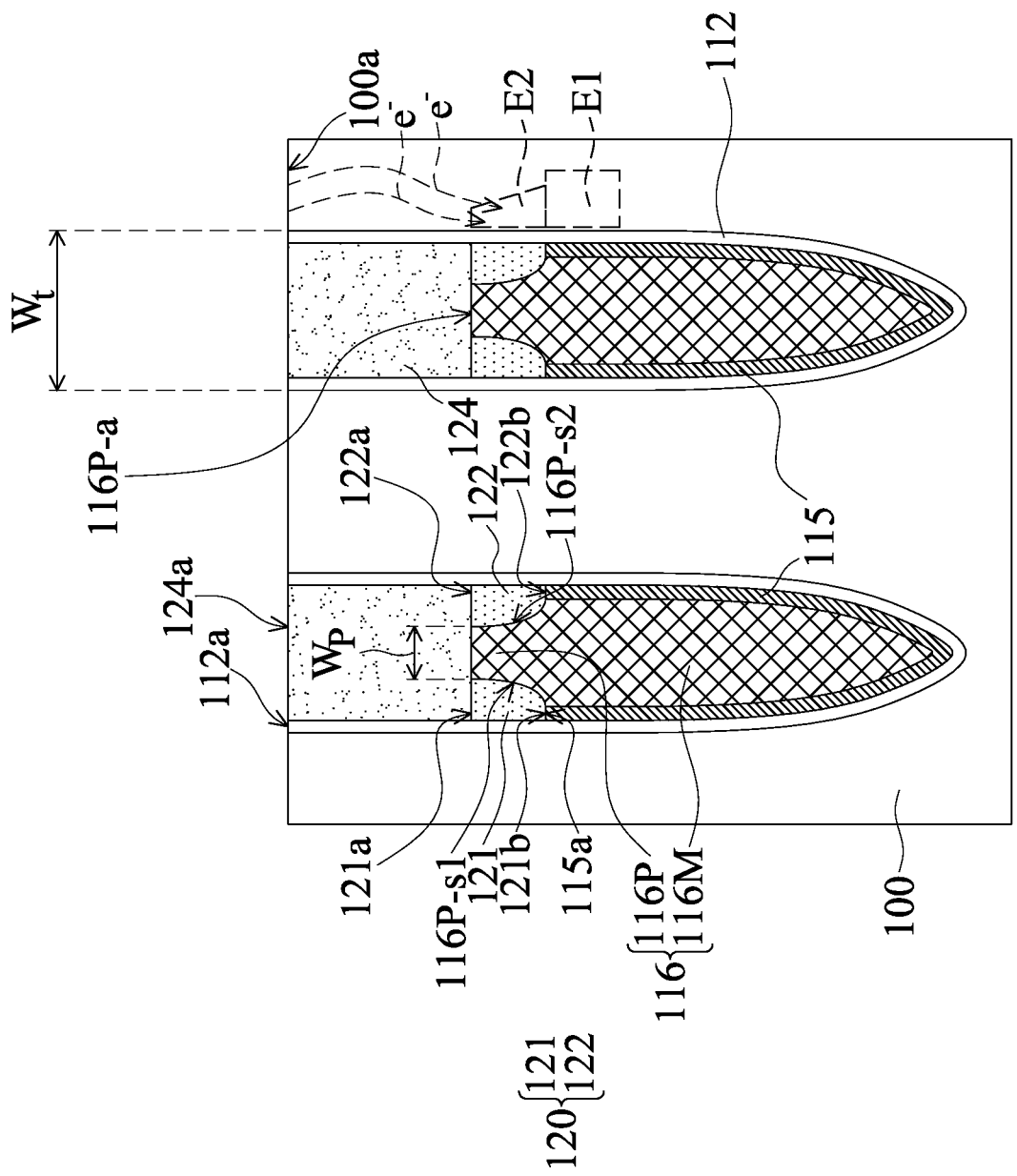

Next, referring to FIG. 1L, a part of the second work function material layer 1200 is removed until the first work function layer 116 is exposed, and a second work function layer 120 is formed. In one embodiment, for example, a part of the second work function material layer 1200 can be removed by an etching back process. As shown in FIG. 1L, the second work function layer 120 includes a first portion 121 and a second portion 122 positioned at opposite sides of the protruding portion 116P of the first work function layer 116. The top surface 116P-a of the protruding portion 116P is level with the top surfaces 121a and 122a of the second work function layer 120, in accordance with some embodiments of the present disclosure. In addition, in one embodiment, the second work function layer 120 covers the top surface 115a of the barrier layer 115. For example, as shown in FIG. 1L, the bottom surface 121b of the first portion 121 and the bottom surface 122b of the second portion 122 of the second work function layer 120 contact and cover the barrier layer 115.

In addition, as shown FIG. 1L, the two opposite sides of the second work function layer 120, that is, the first side surface 116P-s1 and the second side surface 116P-s2 of the protruding portion 116P in FIG. 1L, are slanted to the top surfaces 121a and 122a of the second work function layer 120, in accordance with some embodiments of the present disclosure. In one example, the two opposite side surfaces of the second work function layer 120 have arc-shaped side surfaces, as shown in FIG. 1L.

Next, referring to FIG. 1M, an insulating layer 124 is formed in the trenches 103. The insulating layer 124 covers the top surface 116P-a of the protruding portion 116P and the top surfaces 121a and 122a of the second work function layer 120. In one embodiment, for example, an insulating material is deposited on the substrate 100 as a blanket layer. The insulating material covers the top surface of the gate dielectric layer 112 and fills the trenches 103. Then, the excess portions of the insulating material and the gate dielectric layer 112 outside the trenches 103 are removed until the top surface 100a of the substrate 100 is exposed. After the excess portions of the insulating material and the gate dielectric layer 112 are removed, an insulating layer 124 is formed in each of the trenches 103. The material of the insulating layer 124 includes, for example, silicon nitride or another suitable insulating material. The insulating layer 124 may be formed by a chemical vapor deposition process or another suitable process. In addition, the top surface 124a of the insulating layer 124 is substantially level with the top surface 112a of the gate dielectric layer 112 and the top surface 100a of the substrate 100, in accordance with some embodiments of the present disclosure.

As shown in FIG. 1M, the insulating layer 124 is formed on the protruding portion 116P of the first work function layer 116 and on the second work function layer 120, in accordance with some embodiments of the present disclosure. The insulating layer 124 covers and contacts the top surface 121a of the first portion 121 and the top surface 122a of the second portion 122 of the second work function layer 120. Also, the insulating layer 124 covers and contacts the top surface 116P-a of the protruding portion 116P of the first work function layer 116.

According to the aforementioned descriptions, in the semiconductor structure and its manufacturing method as provided in some embodiments of the present disclosure, the second work function layer 120 is provided at opposite sides of the protruding portion 116P of the first work function layer 116. Therefore, when a channel region of a memory device is switched on, the intensity of the electric field (for example, the electric field E2 in FIG. 1M) generated by the second work function layer 120 that is adjacent to the doped regions on can be reduced. In addition, referring to FIG. 1M again, when a channel region of a memory device is switched on, an electric field E1 is generated near the side of the main portion 116M of the first work function layer 116 (which is adjacent to the doped region of the substrate 100 as a drain region of the memory device), and an electric field E2 is generated near the side of the protruding portion 116P (which is also adjacent to the doped region of the substrate 100 as a drain region of the memory device), in accordance with some embodiments of the present disclosure. The intensity of the electric field E2 is less than the intensity of the generated electric field E1, thereby solving the conventional problem of the gate induced drain leakage current (GIDL).

In addition, in some embodiments, the area of the top surface of the protruding portion 116P of the first work function layer 116 is less than the area of the bottom surface of the protruding portion 116P of the first work function layer 116. For example, the width of the protruding portion 116P of the first work function layer 116 gradually increases from the top surface 116P-a of the protruding portion 116P toward the bottom surface 116P-b of the protruding portion 116P. When a channel region of a memory device is switched on, the intensity of the electric field E2 shown in FIG. 1M can be less than the intensity of the electric field E1, and the electric field E2 also forms gradually increasing electric field intensity from top to bottom. Thus, the difference in the electric field intensity at the junction of the electric field E2 and the electric field E1 can be reduced, thereby greatly suppressing the gate induced drain leakage current (GIDL), in accordance with some embodiments of the present disclosure. If the intensity difference between the electric field E2 and the electric field E1 is too large, the tunneling effect on the electrons (e⁻) leads to the gate induced drain leakage current (GIDL). Specifically, the sudden increase of the electric field intensity in the electric field E1 may pull the electrons that originally stayed in the electric field E2 into the electric field E1, and a large leakage current would be generated, so that the gate induced drain leakage current (GIDL) problem cannot be effectively improved.

Furthermore, when the memory device is operated, if the intensity difference between the electric field E2 and the electric field E1 is too large, it affects not only the stability of the operation performance of each word line, but also the overall electrical performance of the memory device. For example, a memory device typically contains 600 to 900 (or even more) word lines. When the word line is turned on, if there is a sudden change in the electric field intensity between the aforementioned electric field E2 and the electric field E1, it would cause the problem of current leakage, and the amounts of the leakage current of each of the word lines cannot be controlled stably. This would further affect the overall operation speed of the device (for example, the response time of the word line having the lowest operation speed determines the overall response time of the memory device). Therefore, the semiconductor structure and its manufacturing method according to some embodiments of the present disclosure can not only effectively reduce the gate induced drain leakage current (GIDL), but also achieve the electrical uniformity of each of the word lines, thereby improving the electronic characteristics of the devices in the applications and increasing the stability of the operation performance of the devices in the applications.

In addition, according to the manufacturing method proposed in some embodiments, the thickness of the first dielectric material layer can be adjusted according to the actual requirements of the application to determine the width of the mask that is subsequently formed. The mask can be used for etching the first work function material layer underneath, so that the positions and sizes of the holes formed for disposing another work function material (such as polysilicon) can be controlled. This etching step can be regarded as a self-aligned etching process since no extra mask is required for etching the first work function material layer. Therefore, according to the manufacturing method proposed in some embodiments, the manufacturing steps can be simplified, the number of the masks used in the manufacturing method can be reduced, and the manufacturing cost can be decreased. Also, the manufacturing method proposed in some embodiments of the present disclosure is compatible with the current manufacturing process, and has economic values in the applications.

It should be understood that the disclosure has been described by way of example and in terms of the preferred embodiments and is not limited to the disclosed embodiments and preferred embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing a semiconductor structure, comprising:
   providing a substrate, and forming a trench extending downward in the substrate;
   forming a gate dielectric layer on sidewalls and a bottom surface of the trench;
   forming a barrier layer on a lower portion of sidewalls and a bottom surface of the gate dielectric layer;
   forming a first work function layer on a lower portion of the trench, wherein the first work function layer comprises:
      a main portion in the lower portion of the trench, wherein the barrier layer surrounds sidewalls and a bottom surface of the main portion; and
      a protruding portion on the main portion and connecting the main portion, wherein an area of a top surface of the protruding portion is less than an area of a bottom surface of the protruding portion;
   forming a second work function layer at opposite sides of the protruding portion of the first work function layer; and
   forming an insulating layer on the protruding portion of the first work function layer and on the second work function layer,
   wherein forming the barrier layer and forming the first work function layer comprise:
      forming a barrier material layer on the gate dielectric layer;
      forming a first work function material layer on the barrier material layer;
      recessing the first work function material layer to form a recessed first work function material layer;
      forming a mask on the recessed first work function material layer, wherein the mask exposes a portion of a top surface of the recessed first work function material layer;
      performing an etching step by using the mask to remove the portion of the recessed first work function material layer that is not covered by the mask, thereby forming the first work function layer.

2. The method of manufacturing the semiconductor structure as claimed in claim 1, wherein after the portion of the recessed first work function material layer that is not covered by the mask is removed, a hole is formed, and the method comprises:
   removing the mask;
   forming a second work function material layer on the barrier layer and the first work function layer, wherein the second work function material layer fills the hole; and
   removing a portion of the second work function material layer to expose the first work function layer, wherein remaining portions of the second work function material layer forms the second work function layer.

3. The method of manufacturing the semiconductor structure as claimed in claim 1, wherein an upper portion of sidewalls of the barrier material layer is exposed in the trench after the first work function material layer is recessed, and wherein forming the mask comprises:
   conformably depositing a first dielectric material layer on a top surface and the upper portion of sidewalls of the barrier material layer, wherein the first dielectric material layer forms an opening in the trench;
   filling the opening with a second dielectric material layer; and
   removing a portion of the first dielectric material layer that is not covered by the second dielectric layer to form the mask,
   wherein the mask comprises a portion of the second dielectric material layer that fills the opening and a remaining portion of the first dielectric material layer.

4. The method of manufacturing the semiconductor structure as claimed in claim 3, wherein the mask comprises:
   a first dielectric layer on the recessed first work function material layer; and
   a second dielectric layer on the first dielectric layer,
   wherein sidewalls of the first dielectric layer are level with sidewalls of the second dielectric layer.

5. The method of manufacturing the semiconductor structure as claimed in claim 3, wherein a lateral distance between a sidewall of the mask and the sidewall of the trench is equal to a sum of a thickness of the first dielectric material layer and a thickness of the barrier material layer.

6. The method of manufacturing the semiconductor structure as claimed in claim 3, wherein one of the first dielectric material layer or the second dielectric material layer is an oxide material layer, and the other of the first dielectric material layer or the second dielectric material layer is a nitride material layer.

7. The method of manufacturing the semiconductor structure as claimed in claim 1, wherein after the first work function layer is formed, a portion of the barrier material layer is removed, and the remaining portion of the barrier material layer forms a barrier layer.

8. The method of manufacturing the semiconductor structure as claimed in claim 7, wherein after the barrier layer is formed, a top surface of the barrier layer is level with the bottom surface of the protruding portion of the first work function layer.

9. The method of manufacturing the semiconductor structure as claimed in claim 1, wherein after the second work function layer is formed, the second work function layer covers the top surface of the barrier layer.

10. The method of manufacturing the semiconductor structure as claimed in claim 1, wherein when the first work function material layer is recessed to form the recessed first work function material layer, the barrier material layer is not recessed and covers the sidewalls and the bottom surface of the trench.

11. The method of manufacturing the semiconductor structure as claimed in claim 1, wherein after the first work function layer is formed, a width of the protruding portion of the first work function layer gradually increases from the top surface of the protruding portion toward the bottom surface of the protruding portion of the first work function layer.

12. The method of manufacturing the semiconductor structure as claimed in claim 1, wherein after the first work function layer is formed, the opposite sides of the protruding portion have arc-shaped side surfaces from the top surface of the protruding portion to the bottom surface of the protruding portion.

13. The method of manufacturing the semiconductor structure as claimed in claim 1, wherein after the first work function layer is formed, the top surface of the protruding portion of the first work function layer is level with a top surface of the second work function layer.

14. The method of manufacturing the semiconductor structure as claimed in claim 1, wherein.

15. The method of manufacturing the semiconductor structure as claimed in claim 1, wherein after the second work function layer is formed, two opposite side surfaces of the second work function layer are slanted to a top surface of the second work function layer.

* * * * *